March 27, 1962 G. L. PEARSON 3,027,501

SEMICONDUCTIVE DEVICE

Filed Sept. 29, 1959

INVENTOR
G. L. PEARSON
BY
A. J. Torsiglieri
ATTORNEY 3,027,501

SEMICONDUCTIVE DEVICE

Gerald L. Pearson, Bernards Township, Somerset County, N.J., assignor to Bell Telephone Laboratories, Incorporated, New York, N.Y., a corporation of New York Filed Sept. 29, 1959, Ser. No. 843,185
3 Claims. (Cl. 317—234)

Figure 1:
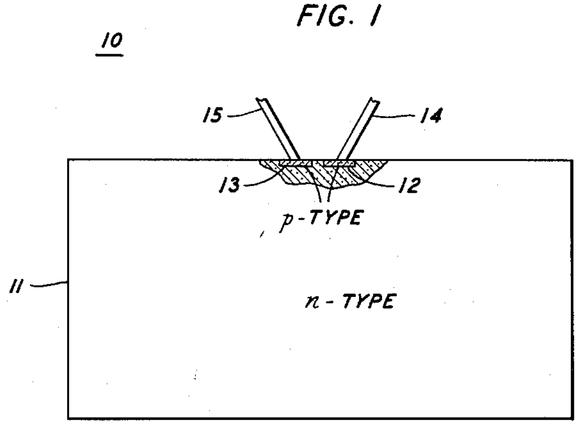

This invention relates to semiconductive devices and more particularly to silicon "Esaki" or tunnel diodes.

The general principles of tunnel diodes are now well known to workers in the art. Such diodes now include a single narrow p-n rectifying junction between two degenerate regions whereby quantum mechanical tunneling results in a negative resistance region in the forward current-voltage characteristic of the diode.

One of the disadvantages associated with such diodes for many applications is the low reverse impedance which is characteristic of such diodes. The reverse impedance of a tunnel diode is defined as the impedance to applied voltages of polarity opposite that useful for achieving the tunneling effect. The low reverse impedance results because the junction is so narrow that breakdown in the reverse direction occurs at low voltages, and beyond breakdown a reversed biased junction offers only a low impedance.

An object of the present invention is a tunnel diode exhibiting a relatively large reverse impedance. Such a diode has applications in circuits where the diode is apt to encounter reverse biases, and it is important to minimize the flow of reverse current in such instances.

A feature of the invention is a second rectifying junction oppositely poled from the tunnel junction in the diode. Since an applied bias of one sense on the tunnel junction corresponds to a bias of opposite sense on the added junction, such added junction must exhibit a low impedance in its reverse direction and a high impedance in the forward direction. The former consideration is important lest there be nullified the negative resistance of the tunnel junction. The latter consideration is important if there is to be attained the desired end of a high reverse impedance for the tunnel diode. Such a junction has characteristics opposite to those usually associated with p-n junctions.

As is set forth in my earlier application Serial No. 742,879, filed June 18, 1958, now Patent No. 2,952,824 I have discovered that it is feasible to provide such a junction. In particular, for example, I have found that an aluminum-alloy junction in n-type silicon having a body resistivity of less than .001 ohm-centimeter will have the desired characteristic.

It is in accordance with my present invention to incorporate in a silicon diode both a tunnel junction and a junction of the kind described in such application. Accordingly, an illustrative embodiment of the invention comprises a diode including a monocrystalline silicon wafer whose bulk is n-type and of a specific resistivity less than about .001 ohm-centimeter. The wafer further includes an aluminum-boron-alloy junction and an aluminum-alloy junction. The former serves as the tunnel junction providing a negative resistance characteristic, and the latter serves to insert in the diode a high impedance for applied voltages of polarity opposite that useful for the tunnel effect and a low impedance for applied voltages of polarity useful for the tunnel effect.

Figure 2:
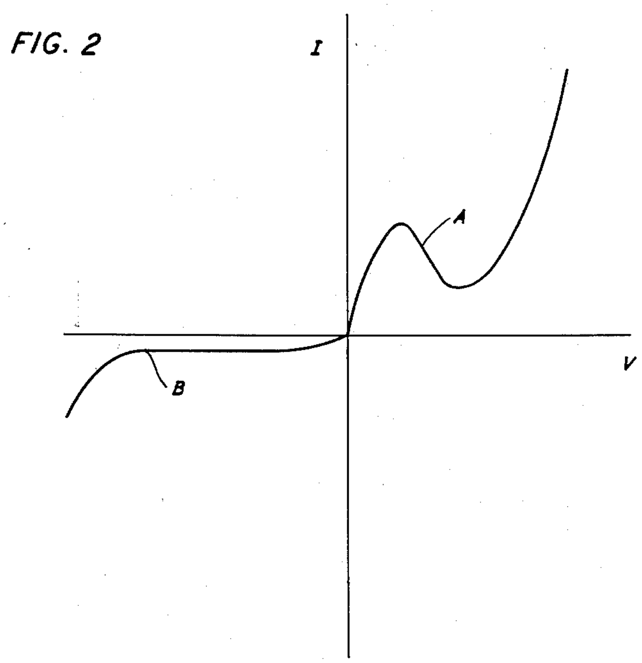

The invention will be better understood from the following more detailed description, taken in conjunction with the accompanying drawing, in which:

FIG. 1 shows in section as an illustrative embodiment of the invention a silicon diode including a pair of alloy rectifying junctions, and FIG. 2 is a plot of the voltage-current characteristic of the diode of FIG. 1.

With reference now to FIG. 1, the diode 10 comprises a monocrystalline silicon wafer 40 mils square and 20 mils thick whose bulk portion 11 is of n-type conductivity and has a specific resistivity of about .001 ohm-centimeter. The wafer also includes a p-type aluminum-alloy region 12 and a p-type aluminum-boron-alloy region 13. Because of the higher solubility in silicon of boron than aluminum, the regrowth portion of the aluminum-boron region will have a higher density of acceptors than the regrowth portion of the aluminum-alloy region. It is this which results in the different properties of the two junctions. In particular, the junction to exhibit the tunnel effect divides two degenerate regions while the junction to exhibit the low reverse impedance and high forward impedance divides a degenerate region from one not quite so. An aluminum wire 14 makes a low resistance ohmic connection to region 12 and a wire 15 of an aluminum-boron alloy (.75 percent boron) makes a low resistance ohmic connection to the region 13. The spacing between wires 14 and 15 is about 10 mils. The wires 14 and 15 have diameters of about 5 mils and 3.5 mils, respectively, and are used to form the associated alloy regions 12 and 13, respectively, in the manner to be described and, accordingly, fix the dimensions of such alloy regions.

The diode described was fabricated as follows: There was first cut from a single crystal of n-type silicon having a specific resistivity of about .001 ohm-centimeter a wafer 40 mils square and 20 mils thick. The wafer was first etched lightly for cleaning the surface. A suitable etchant was a mixture of about equal parts of concentrated nitric and hydrofluoric acids. The wafer was thereafter rinsed in turn in deionized water and methyl alcohol. After drying, the wafer was positioned on a tantalum strip heater and a 5 mil aluminum wire and a 3.5 mil aluminum-boron (.75 percent boron) wire were each positioned to have one of its ends in light pressure contact with one of the square faces of the wafer. The wires were positioned to have their centers about twenty mils apart. A current was then passed through the tantalum strip to heat the wafer quickly to a temperature above both the aluminum-silicon eutectic and the aluminum-boron-silicon eutectic whereby each of the wires was alloyed to the silicon wafer. The heating was continued for about four seconds. The alloying was done in a helium atmosphere. To insure quick freezing after the heating was discontinued, the wafer was blasted with compressed air. Such quick freezing is especially important to provide the narrow p-n junction at the interface of alloy region 13 important to achieve efficient tunneling.

In FIG. 2 there is plotted the voltage-current characteristic of the diode described. In this plot, a positive voltage corresponds to a forward bias on the aluminum-boron-alloy junction. It will be noted that the characteristic includes both a negative-resistance portion A associated with the tunnel effect across the aluminum-boron-alloy junction and a high-resistance portion B associated with the application of a forward bias on the aluminum-alloy region.

It will, of course, be apparent that the desired end of a tunnel diode having a high reverse impedance can be achieved in a variety of other diode designs without departing from the spirit and scope of the invention. Additionally, of course, various modifications may be made in the design and/or process described, depending on the characteristics sought. For example, it is, of course, feasible to provide an electrode connection to the bulk of the body for permitting the application of a bias.

What is claimed is:

1. A tunnel diode of high reverse resistivity comprising a monocrystalline wafer whose bulk portion is n-type and has a specific resistivity of less than about .001 ohm-centimeter, and which further includes a p-type aluminum-alloy region and a p-type aluminum-boron-alloy region, and separate electrode connections to the aluminum-alloy region and the aluminum-boron-alloy region.

2. A tunnel diode having a high reverse impedance comprising a monocrystalline n-type silicon wafer of degenerate material, an aluminum wire alloyed to one surface portion of the wafer, and an aluminum-boron wire alloyed to a different portion of the surface of the wafer.

3. A tunnel diode having a high reverse impedance comprising a semiconductive wafer whose bulk portion is of degenerate material of one conductivity type and which includes a first discrete portion of degenerate material of opposite conductivity type for forming therebetween a p-n junction which exhibits a negative resistance tunnel characteristic and a second discrete portion of not quite so degenerate material of opposite conductivity type for forming a p-n junction which exhibits a higher impedance in the forward direction than the reverse direction, and separate low resistance connections to said two discrete portions.

References Cited in the file of this patent

UNITED STATES PATENTS 2,829,999 Gudmundsen ------------ Apr. 8, 1958